(12) United States Patent
Singh et al.

(10) Patent No.: US 6,255,141 B1
(45) Date of Patent: Jul. 3, 2001

(54) METHOD OF PACKAGING FUSES

(75) Inventors: Inderjit Singh, San Jose; Hem P. Takiar, Fremont; Ranjan J. Mathew, San Jose; Nikhil V. Kelkar, Santa Clara, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/391,137

(22) Filed: Sep. 7, 1999

(51) Int. Cl.[7] ................................................ H01L 21/82
(52) U.S. Cl. .................... 438/123; 438/333; 438/132; 257/81
(58) Field of Search ................................. 438/52, 55, 64, 438/68, 74, 461, 462, 666, 667

(56) References Cited

U.S. PATENT DOCUMENTS 3,784,948 * 1/1974 Johnston et al. ...................... 338/183
3,925,801 * 12/1975 Haitz et al. ............................ 257/81
4,627,151 * 12/1986 Mutholland et al. ................. 438/111

FOREIGN PATENT DOCUMENTS

401133315 * 5/1989 (JP) ...................................... 361/534

* cited by examiner

Primary Examiner—Eddie C. Lee
Assistant Examiner—Paul E Brock
(74) Attorney, Agent, or Firm—Beyer Weaver & Thomas, LLP

(57) ABSTRACT

Improved methods of packaging external fuses together with integrated circuit devices are described. A pair of frame strips are provided that each have an associated set of contact pads. A resistor paste is applied to one of the contact pad sets and the frame strips are laminated together by curing the resistor paste which is positioned between the contact pad sets. Dice are mounted to the opposite sides of the second contact pads to form integrated circuit devices having integrally packaged external fuses. The packaged devices are eventually singulated for use. In some embodiments, the contact pads each have downturned tabs that form wings on opposite sides of each die. When the dice are flip chips, a device may be attached to a substrate board by soldering both the bumps on the die and the tab wing tips to the substrate board. In a preferred embodiment, the resistor paste is a positive temperature coefficient resistor paste.

12 Claims, 6 Drawing Sheets

METHOD OF PACKAGING FUSES

BACKGROUND OF THE INVENTION

The present invention relates generally to methods of packaging integrated circuit devices, such as flip chip dice, with externally mounted but integrally packaged fuses. More particularly, the fuses are formed using lead frame lamination techniques.

In a number of electrical components it is desirable to provide fuses to protect against electrical surges. There are currently a number of commercially available fuse styles. One available type of fuse is known as a positive temperature coefficient fuse. A representative positive temperature coefficient (PTC) fuse is illustrated in FIGS. 1(a) and 1(b). As seen in FIG. 1(a), the representative PTC fuse 50 has a top plate (top contact pad) 52 and a bottom plate (bottom contact pad) 54 that are separated by a positive temperature coefficient resistor material 56. The contact pads 52 and 54 each have tabs 57, 59 which are bent down to form wings that define a cavity 61 beneath the bottom contact pad 54.

A die 64, such as a flip chip packaged Zener diode is then attached to the bottom surface of the bottom contact pad within the cavity 61 as best seen in FIG. 1(b). Solder posts 67 are formed on the tips of bent down tabs 57, 59. With this arrangement, the fuse can be mounted on a printed circuit board (or other appropriate substrate) by soldering the tab tip solder post 67 and the die's solder bumps 66 to appropriate landings on the printed circuit board.

The described PTC fuses are used in a number of applications. However, they are generally relatively expensive to package. Accordingly, there are continuing efforts to develop improved methods for packaging such fuses.

SUMMARY OF THE INVENTION

To achieve the forgoing and other objects and in accordance with the purpose of the invention, an improved method of packaging external fuses together with integrated circuit devices is described. A pair of frame strips are provided that each have an associated set of contact pads. A resistor paste is applied to one of the contact pad sets and the frame strips are laminated together by curing the resistor paste. The contact pads sets are aligned with one another with the resistor paste there between to form a plurality of fuses. Dice are then mounted on the opposite side of one of the contact pad sets to form integrated circuit devices having integrally packaged external fuses. The packaged devices are eventually singulated for use.

In some embodiments, the contact pads each have downturned tabs that form wings on opposite sides of their associated die. When the dice are flip chips, a device may be attached to a substrate board by soldering bumps on the singulated die and soldering the tab wing tips to the substrate board.

In a preferred embodiment, the resistor paste is a positive temperature coefficient resistor paste.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 2A:
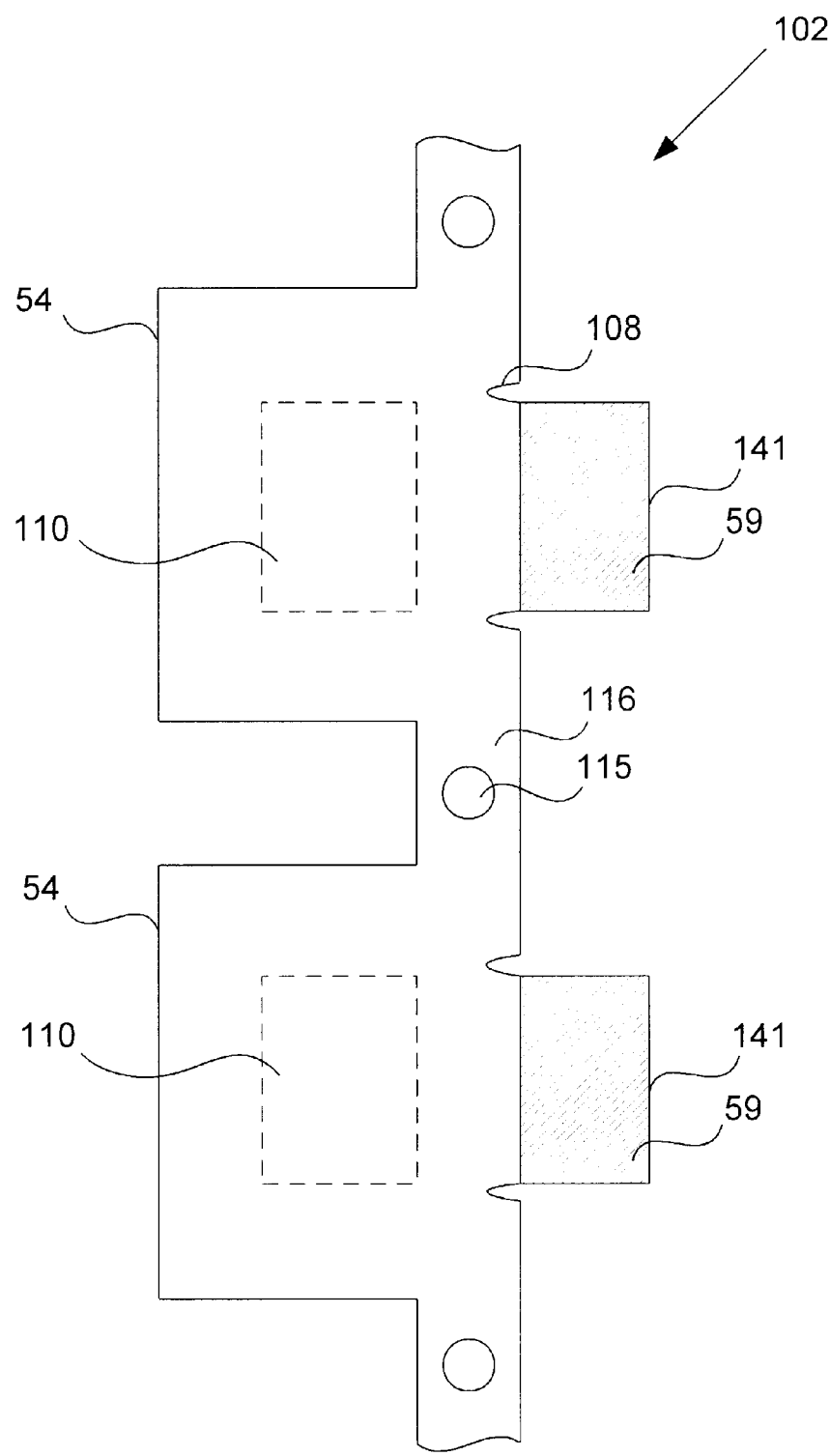
FIG. 2(a) is a top view of a bottom frame strip suitable for use in conjunction with the present invention.

Referring initially to FIG. 2(a), a bottom frame strip 102 is formed that has a series of bottom contact pads (bottom plates) 54. Each bottom contact pad 54 includes a tab 59, a pair of notches 108 adjacent the tab 59 and a recess 110 formed on the bottom surface of the contact pad. The notches 108 are provided to facilitate bending the tabs 59 down to form registration wings as described in more detail below. The recesses 110 are sized and shaped to receive a die to be used in conjunction with the finished fuse. More specifically, the recesses act as a registration guide that helps position the die when the die is mounted to the bottom contact pad 54.

The bottom frame strip 102 also has a series of alignment holes 115 in spacing bars 116 located between adjacent contact pads 54. The alignment holes are used to align the bottom frame strip 102 with the top frame strip during later proesssing. The bottom frame strip may be any suitable size and may be arranged to hold a one or two dimensional array of bottom contact pads 54. One goal is to permit the frame strips to be handled by conventional semiconductor packaging lead frame handling equipment. By way of example, a 20 mil thick lead frame blank having a ¾ inch by 5 inch configuration works well. Of course, the thickness of the lead frame blank will be primarily dictated by the desired contact pad thickness. The width and length of the lead frame blank will typically be primarily dictated by the available handling equipment. The contact pads and other features of the frame strips may be formed by any suitable lead frame fabrication techniques such as stamping or etching.

The recesses 110 may be any suitable size. By way of example, recess depths on the order of ½ to 1 mil work well. Recess footprints on the order of 5 mils larger in each direction than the footprint of the die it is intended to receive also work well. The recesses may be formed using any conventional technique. By way of example stamping and etching work well to form the recesses.

Figure 2B:
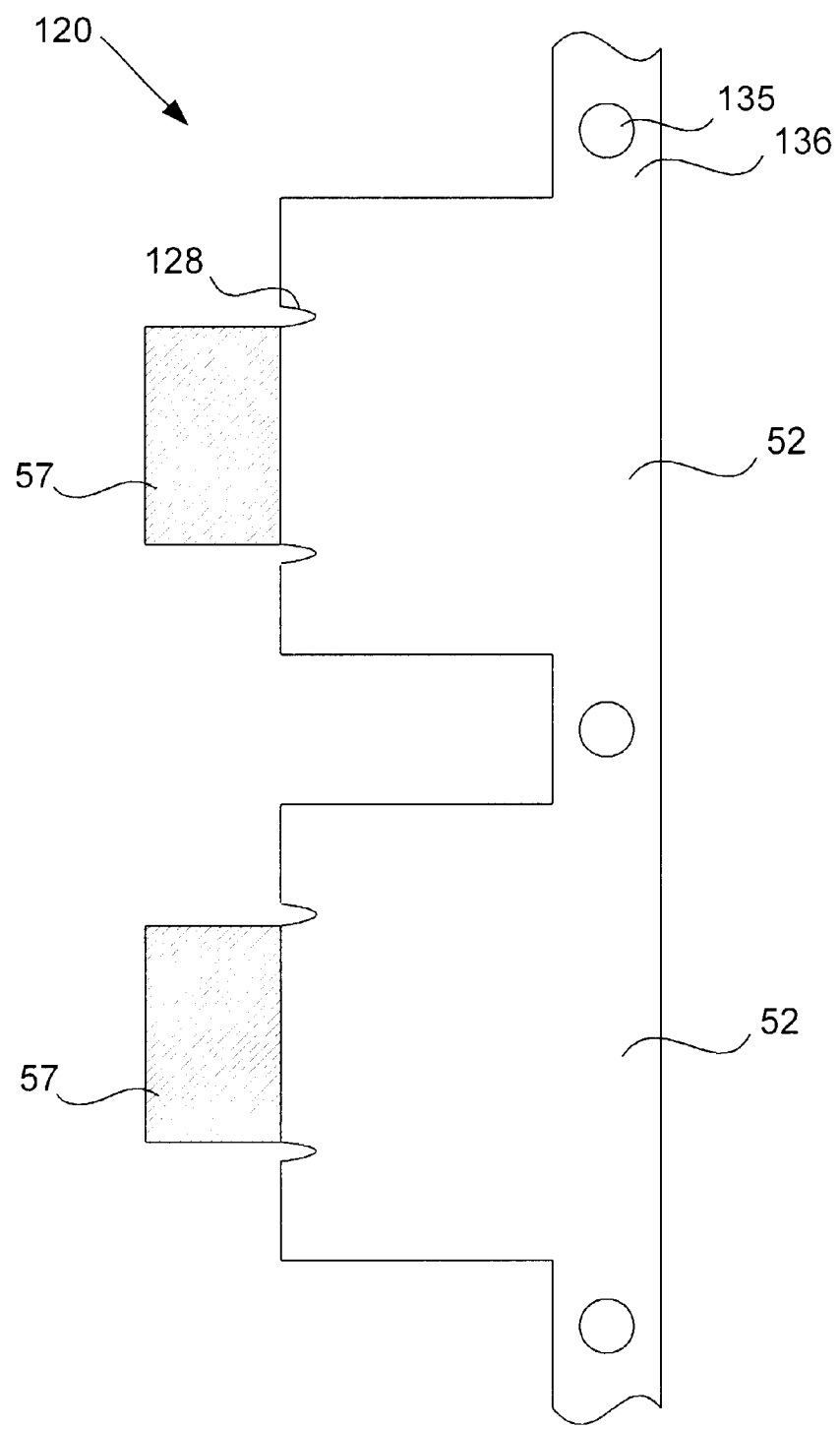
FIG. 2(b) is a top view of a top frame strip suitable for use in conjunction with the bottom frame strip of FIG. 2(a).

The top frame strip 120 is formed very similarly to the bottom frame strip 102. A representative top frame strip 120 is illustrated in FIG. 2(b). As seen therein, the top frame strip 102 includes a series of top contact pads (top plates) 52. Each top contact pad 52 includes a tab 57 and a pair of notches 128 adjacent the tab 57. The notches 128 are provided to facilitate bending the tab 57 down to form a registration wing.

Like the bottom frame strip 102, the top frame strip 120 also has a series of alignment holes 135 in spacing bars 136 located between adjacent contact pads 52. The alignment holes are used to align the top and bottom frame strips 102 during later processing. The overall dimensions of the top frame strip are intended to be complementary with the bottom frame strip and will have an array of top contact pads 52 that match the array of bottom contact pads 54 in the bottom frame strip 102. Thus, the lead frame blanks used to form the top frame strip 120 may be the same as the blanks used for the bottom frame strip 102.

Figure 1A:
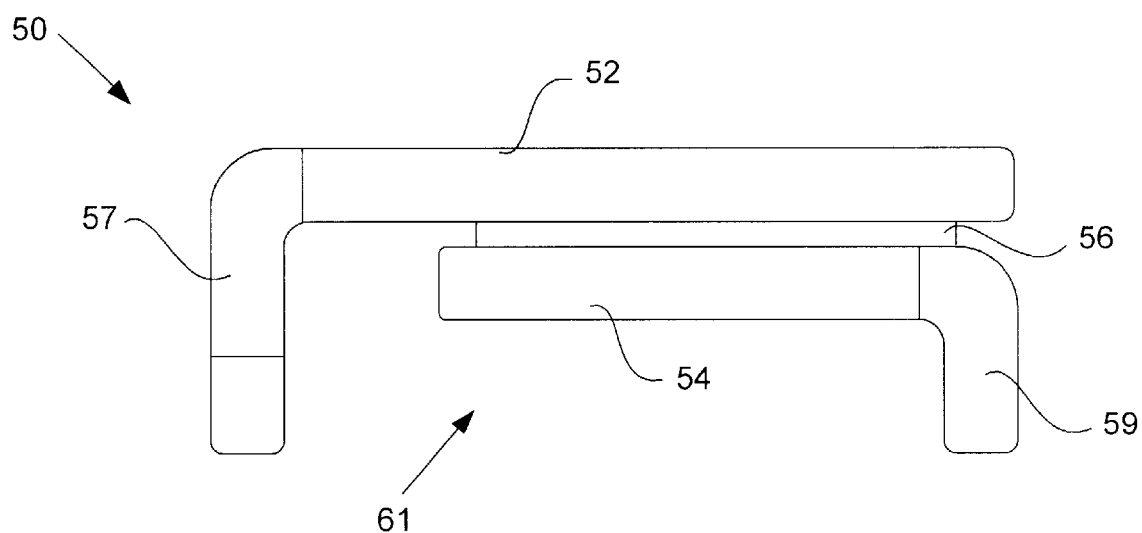
FIG. 1(a) is a diagrammatic side view of a positive temperature coefficient fuse.
Figure 1B:
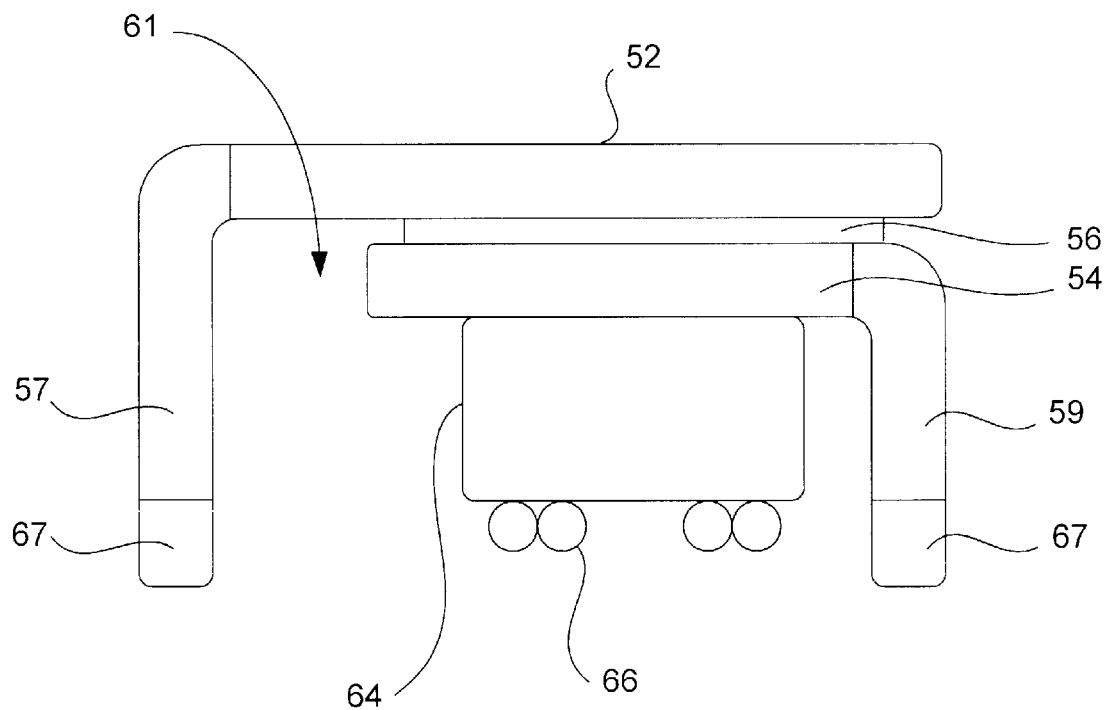
FIG. 1(b) is a diagrammatic side view of the fuse illustrated in FIG. 1(a) with a die attached thereto.
Figure 5:
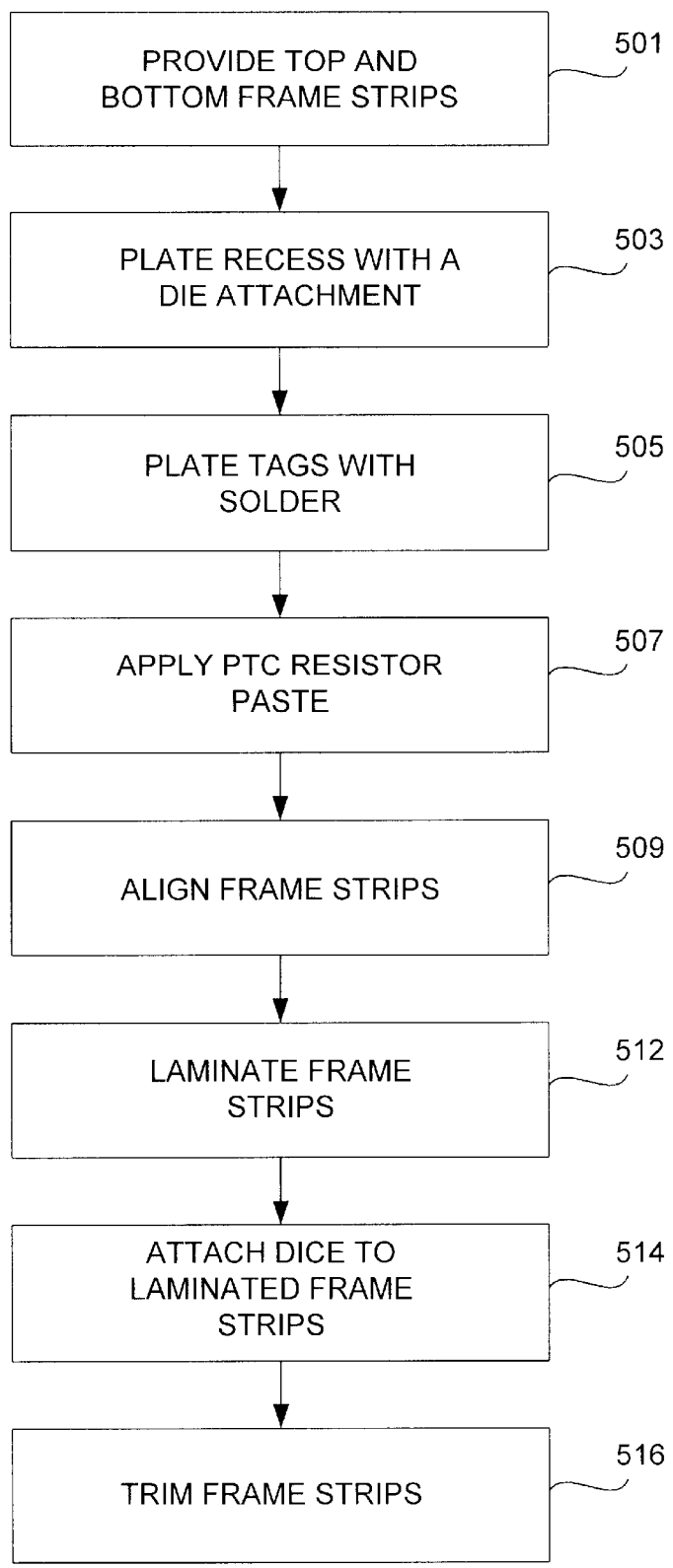
FIG. 5 is a flow chart illustrating a method of packaging integrated circuits with integral external fuses.

Referring now to the flow chart of FIG. 5, a method of packaging flip chip devices with externally mounted fuses using the frame strips 102, 120 illustrated in FIGS. 1(a) and 1(b) will be described. Initially in step 501 the described top and bottom frame strips are fabricated or provided. In step 503, the recess 110 is plated with an appropriate die attach material. By way of example, 63/37 tin-lead solder may be used to facilitate eutectic die attach. Of course, a wide variety of other conventional die attach materials may be used as well. In step 505 the surfaces of tabs 57 and 59 are plated with appropriate solder material. The tabs are solder plated to facilitate their eventual attachment to a substrate such as a printed circuit board.

In step 507 a resistor paste is dispensed on the bottom surface of the top contact pads 52 in the top frame strip 120. The resistor paste can be any material suitable for forming a fuse. In the described embodiment, the resistor paste is a positive temperature coefficient (PTC) resistor paste. Suitable PTC pastes are available from a variety of sources.

Figure 3:
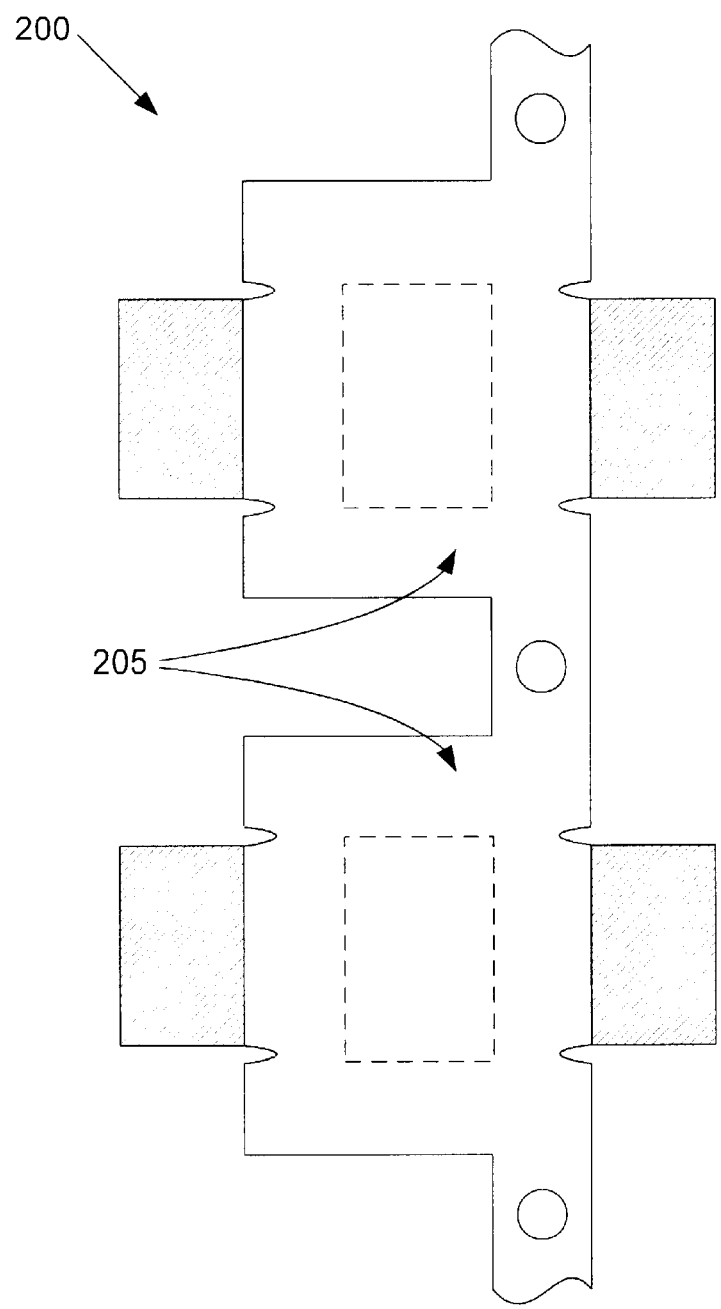
FIG. 3 is a top view of the top and bottom frame strips after they have been laminated together.

After the resistor paste has been dispensed, the top and bottom frame strips are aligned in step 509 using the alignment holes 115, 135 as guides. The resulting alignment is best illustrated in FIG. 3, which is a top view of the superimposed top and bottom frame strips. It should be appreciated that when the frame strips are aligned, each top contact pad is positioned directly over an associated bottom contact pad with the resistor paste (which was dispensed on the bottom surface of the top contact pad) being positioned therebetween.

Once the frame strips are aligned they are laminated together by curing the PTC resistor paste at an appropriate temperature and pressure to form laminated frame strip 200. (Step 512). By way of example, curing temperatures of not more than about 100° C. are typical, although the appropriate curing temperatures will vary greatly with the resistor material used. At this point, the laminated frame strips 102, 120 form an array of positive temperature coefficient fuses 205.

At this point, the fuses 205 are ready for die attachment. It should be appreciated that since the fuses 205 are still attached to the laminated frame strips 200, conventional semiconductor die attach equipment can be used to mount dice 64 to the laminated frame strip 200. The dice are preferably flip chip packaged integrated circuits having solder bumps 66 formed thereon. However, other packaging arrangements such as ball grid arrays and pin grid arrays may be used as well. In the described embodiment, the flip chip packaged integrated circuits 64 are Zener diodes, although the described packaging arrangement can be used in conjunction with a wide variety of semiconductor devices.

Figure 4:
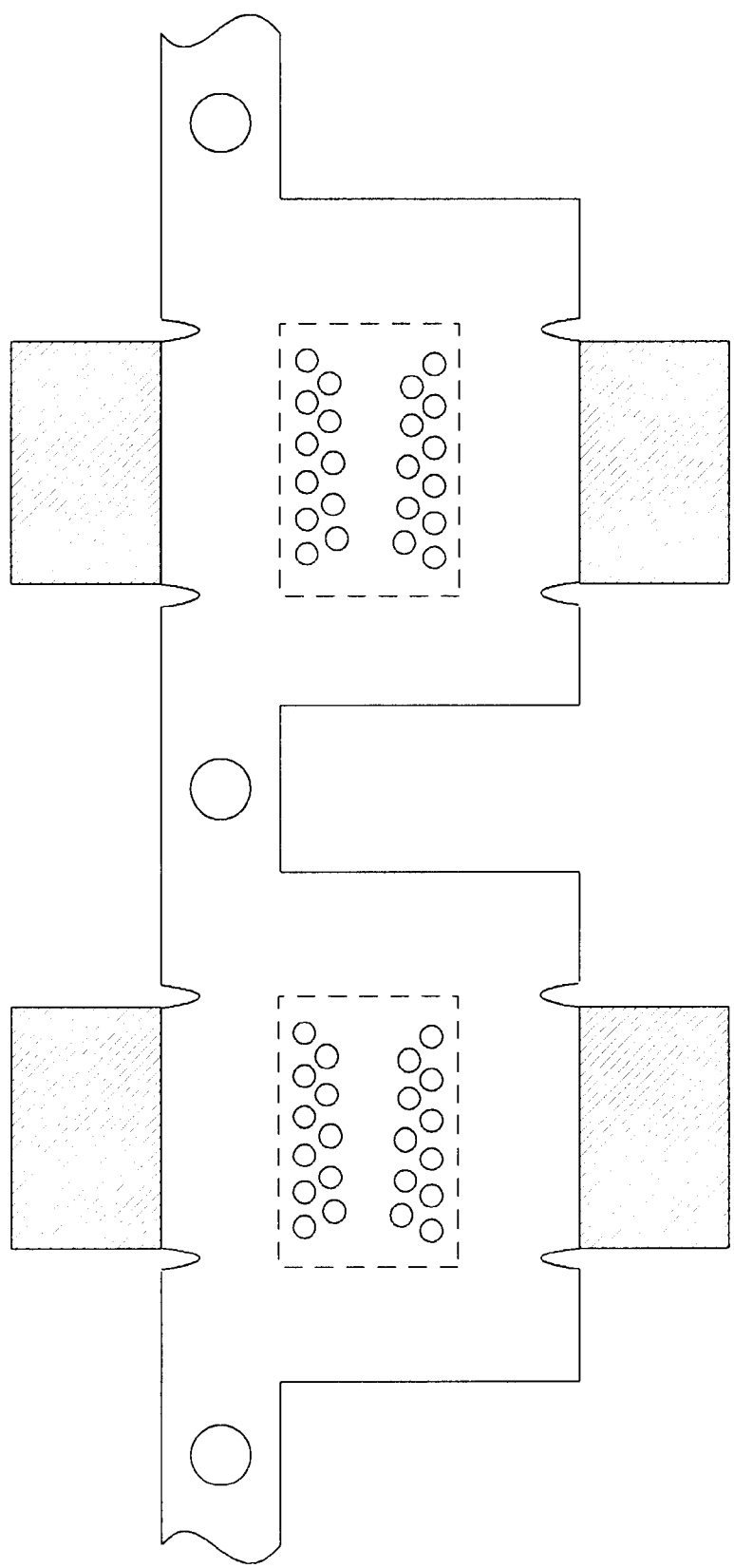
FIG. 4 is a bottom view of the laminated frame strips of FIG. 3 after die attach.

In step 514, the dice are attached to the bottom surface of the bottom frame strip 102 as best seen in FIG. 4. More specifically, recesses 110 in the bottom surface of the bottom contact pads serve as landings for the dice. As described above with respect to step 503, the landing are plated with an appropriate die attach material such as solder. With this arrangement, the die attachment can be done using conventional die attach equipment that is set up to attach dice to lead frames.

After the dice have been attached, the devices are formed and trimmed in step 516 using appropriate forming and trimming tools. The tabs 57, 59 are bent 90° to form wings that protect their associated die by forming a cavity 61 that receives the die. The tabs can be bent using any suitable technique. By way of example, a conventional roller punch within a forming and trimming tool can be used to bend the tabs. It should be appreciated that the notches 108, 128 The trimming tool also singulates the devices by shearing the spacing bars 116, 136 in the region of the alignment holes 115, 135. At the same time, the trimming tool trims away the handling and support rails (not shown). The singulated devices can then be handled and utilized as desired. In many instances, the singulated devices will be picked and placed in a tape and reel.

The resulting separated positive temperature coefficient fuse devices have a final appearance that is quite similar to the conventional devices illustrated above with respect to FIG. 1(b). With the described arrangement, the device can be mounted on a printed circuit board (or other appropriate substrate) by soldering the tab tip solder post 67 and the die's solder bumps 66 to appropriate landings on the printed circuit board.

Although only a few embodiments of the present invention has been described, it should be understood that the present invention may be embodied in many other specific forms without departing from the spirit or scope of the invention. Particularly, in several instance the order of the described steps may be altered. Additionally new steps may be added and in some circumstances described steps may be deleted. The dimensions of the lead frame blanks, the contact pad features and other components may be widely varied in accordance with the needs of a particular application as well. The invention has been primarily described in the context of Zener diode integrated circuits. However, it should be appreciated that the invention may be applied to a variety of other integrated circuit devices as well. Therefore, the present examples are to be considered as illustrative and not restrictive, and the invention is not to be limited to the details given herein, but may be modified within the scope of the appended claims.

What is claimed is:

1. A method of forming fuses suitable for use in conjunction with integrated circuit devices, the method comprising:

providing a first frame strip having a set of first contact pads formed thereon;

providing a second frame strip having a set of second contact pads formed thereon;

applying a resistor paste to one of the first contact pads and the second contact pads; and laminating the first and second frame strips together such that the first and second contact pads sets are aligned with one another with the resistor paste there between to form a plurality of fuses.

2. A method as recited in claim 1 further comprising mounting a set of integrated circuit dice to the set of second contact pads such that each second contact pad has an integrated circuit die mounted thereon on a surface located opposite the resistor paste, thereby forming integrated circuit devices having integrally packaged external fuses.

3. A method as recited in claim 2 wherein the first and second contact pads each have tabs formed thereon, the method further comprising the step of downturning the tabs to form wings on opposite sides of each die.

4. A method as recited in claim 2 further comprising the step of singulating the plurality of integrated circuit devices having integrally packaged external fuses.

5. A method as recited in claim 2 wherein the second contact pads each have recesses formed therein and each integrated circuit die is mounted in the recess of an associated second contact pad.

6. A method as recited in claim 1 further comprising mating the first and second frame strips together to superimpose the first and second contact pads and wherein the first and second frame strips are laminated together by curing the resistor paste after the first and second frame strips have been mated together.

7. A method as recited in claim 1 wherein the resistor paste is a positive temperature coefficient resistor paste.

8. A method as recited in claim 1 wherein the resistor paste is applied to the first contact pads.

9. A method of forming positive temperature coefficient fuses suitable for use in conjunction with integrated circuit devices, the method comprising:

provide a first frame strip having a set of first contact pads formed thereon, each first contact pad having an associated first tab;

providing a second frame strip having a set of second contact pads formed thereon, each second contact pad having an associated second tab;

applying a positive temperature coefficient resistor paste to one of the first contact pads and the second contact pads;

aligning the first and second frame strips to superimpose the first and second sets of contact pads with the positive temperature coefficient resistor paste therebetween;

laminating the first and second frame strips together by curing the positive temperature coefficient resistor paste such that the first and second contact pads sets are aligned with one another to form a plurality of positive temperature coefficient fuses;

mounting a set of integrated circuit dice to the set of second contact pads such that each second contact pad has an integrated circuit die mounted thereon on a surface located opposite the positive temperature coefficient resistor paste, thereby forming integrated circuit devices having integrally packaged external fuses;

downturning the tabs to form wings on opposite sides of each die; and singulating the plurality of integrated circuit devices having integrally packaged external fuses.

10. A method as recited in claim 9 wherein the dice are solder bumped zener diodes.

11. A method as recited in claim 10 wherein:

the second contact pads each have recesses formed therein and each integrated circuit die is mounted in the recess of an associated second contact pad; and the resistor paste is applied to the first contact pads.

12. A method as recited in claim 9 wherein the integrated circuit dice are flip chip dice, the method further comprising the step of attaching a singulated integrated circuit device to a substrate board by soldering bumps on the singulated integrated circuit device and tips of the wings to the substrate board.

* * * * *